United States Patent
Liu et al.

(10) Patent No.: US 11,671,060 B2
(45) Date of Patent: Jun. 6, 2023

(54) POWER AMPLIFICATION APPARATUS AND METHOD HAVING DIGITAL PRE-DISTORTION MECHANISM

(71) Applicant: REALTEK SEMICONDUCTOR CORPORATION, Hsinchu (TW)

(72) Inventors: Hang Liu, Singapore (SG); Wen-Shan Wang, Hsinchu (TW); Chien-I Chou, Hsinchu (TW); Kiat-Seng Yeo, Singapore (SG)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 113 days.

(21) Appl. No.: 17/225,549

(22) Filed: Apr. 8, 2021

(65) Prior Publication Data

US 2022/0060154 A1    Feb. 24, 2022

(30) Foreign Application Priority Data

Aug. 20, 2020  (TW) .................................. 109128481

(51) Int. Cl.
*H03F 1/26* (2006.01)
*H03F 1/32* (2006.01)
*H03F 3/24* (2006.01)

(52) U.S. Cl.
CPC .............. *H03F 1/3294* (2013.01); *H03F 3/24* (2013.01); *H03F 1/3247* (2013.01)

(58) Field of Classification Search
CPC ........ H03F 1/3294; H03F 3/24; H03F 1/3247; H03F 1/3241; H03F 1/3229; H03F 1/30;
(Continued)

(56) References Cited

U.S. PATENT DOCUMENTS 7,251,298 B1 * 7/2007 Hietala .................... H04B 1/26
455/196.1
7,646,238 B2 * 1/2010 Okazaki ................ H03F 1/3294
330/149

(Continued)

FOREIGN PATENT DOCUMENTS

TW          201029319 A1    8/2010
TW          201328172 A1    7/2013

OTHER PUBLICATIONS

OA letter of the counterpart TW application (appl. no. 109128481) mailed on Oct. 27, 2020. Summary of the OA letter: 1. Claims 1 and 6 are rejected as being unpatentable over the disclosure of the cited reference 1 (TW 201328172 A1, also published as US2013166259A1) in view of the cited reference 2 (TW 201029319 A1, also published as US8102207B2). 2. Claims 2~5 and 7~10 are allowed.

*Primary Examiner* — Khanh V Nguyen
(74) *Attorney, Agent, or Firm* — WPAT, P.C.

(57) ABSTRACT

The present invention discloses a power amplification apparatus having a digital pre-distortion mechanism that includes a digital pre-distortion circuit and a power amplifier. The digital pre-distortion circuit receives an original digital signal having an original real part and an original imaginary part. When a first one and a second one of the original real part and the original imaginary part are a low state voltage level and a high state voltage level, the digital pre-distortion circuit outputs a first and a second voltage levels equivalent to the low state voltage level as a first pre-distortion part and directly outputs the second one of the original real part and the original imaginary part as a second pre-distortion part to generate an input signal having an input real part and an input imaginary part each corresponding to one of the first pre-distortion part and the second pre-distortion part. The power amplifier receives the input signal to perform power amplification to generate an output signal.

10 Claims, 3 Drawing Sheets

(58) Field of Classification Search
CPC .......... H03F 1/3223; H03F 2201/3209; H03F 2201/3221; H03F 2201/3224; H03F 2201/3227
USPC .............................. 330/149; 375/296, 297
See application file for complete search history.

(56) References Cited

U.S. PATENT DOCUMENTS

| | | | |
|---|---|---|---|
| 8,068,557 B2* | 11/2011 | Dalipi | H03F 1/3294 375/295 |
| 8,102,207 B2 | 1/2012 | Day | |
| 9,450,544 B2* | 9/2016 | Chang | H03F 1/3247 |
| 10,333,764 B1* | 6/2019 | Arditti Ilitzky | H03C 3/403 |
| 2004/0264596 A1* | 12/2004 | Vella-Coleiro | H03F 1/3294 375/297 |
| 2013/0166259 A1 | 6/2013 | Weber et al. | |

* cited by examiner

POWER AMPLIFICATION APPARATUS AND METHOD HAVING DIGITAL PRE-DISTORTION MECHANISM

BACKGROUND OF THE INVENTION

1. Field of the Invention

The present invention relates to a power amplification apparatus and a power amplification method having digital pre-distortion mechanism.

2. Description of Related Art

A power amplifier usually operates with a lower load resistance to generate a higher output power. In general, the load resistance is fixed such that the power of the output signal is irrelevant to the load resistance and has a one-to-one relation only with the voltage and the current of the input signal.

However, for the power amplifier implemented by such as an IQ-based radio frequency analog-to-digital converter, the variation of the operation status of the power amplifier makes the fixed load deviate from the ideal load under the actual operation status such that the relation between the input signal and the output signal becomes non-linear. When one of the real part and the imaginary part of the input signal is a low state and the other one is a high state, the part having the high state voltage level can be affected by the part having the low state voltage level due to the deviation of the load and is not able to be outputted with full-swing. The output signal thus is not able to have the largest power and the efficiency of the power amplifier decreases.

SUMMARY OF THE INVENTION

In consideration of the problem of the prior art, an object of the present invention is to supply a power amplification apparatus and a power amplification method having a digital pre-distortion mechanism.

The present invention discloses a power amplification apparatus having a digital pre-distortion mechanism that includes a digital pre-distortion circuit and a power amplifier. The digital pre-distortion circuit is configured for performing the following steps. An original digital signal having an original real part and an original imaginary part is received. A first one of the original real part and the original imaginary part is determined to be a low state voltage level and a second one of the original real part and the original imaginary part is determined to be a high state voltage level. Digital pre-distortion is performed to output a first voltage level and a second voltage level in an interlaced manner as a first pre-distortion part that is equivalent to the low state voltage level, and directly output the second one of the original real part and the original imaginary part as a second pre-distortion part, in order to generate an input signal having an input real part and an input imaginary part each corresponding to one of the first pre-distortion part and the second pre-distortion part. The power amplifier is configured for receiving the input signal to perform power amplification in order to generate an output signal.

The present invention also discloses a power amplification method having a digital pre-distortion mechanism used in a power amplification apparatus that includes the steps outlined below. An original digital signal having an original real part and an original imaginary part are received by a digital pre-distortion circuit. When a first one of the original real part and the original imaginary part is determined to be a low state voltage level and a second one of the original real part and the original imaginary part is determined to be a high state voltage level by the digital pre-distortion circuit, digital pre-distortion is performed by the digital pre-distortion circuit to output a first voltage level and a second voltage level in an interlaced manner as a first pre-distortion part that is equivalent to the low state voltage level, and directly output the second one of the original real part and the original imaginary part as a second pre-distortion part, in order to generate an input signal having an input real part and an input imaginary part each corresponding to one of the first pre-distortion part and the second pre-distortion part. The input signal is received by a power amplifier to perform power amplification to generate an output signal.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide a power amplification apparatus and a power amplification method having a digital pre-distortion mechanism.

Figure 1:
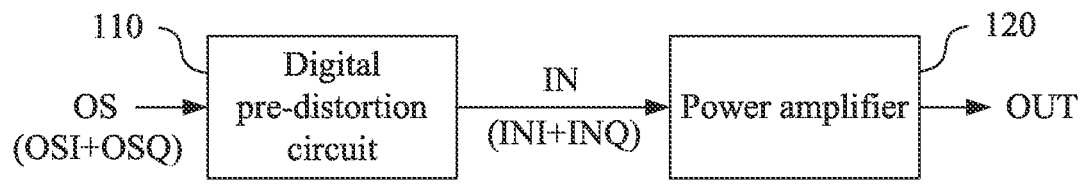
FIG. 1 illustrates a block diagram of a power amplification apparatus circuit diagram of a according to an embodiment of the present invention.

Reference is now made to FIG. 1. FIG. 1 illustrates a block diagram of a power amplification apparatus 100 having a digital pre-distortion mechanism according to an embodiment of the present invention.

In an embodiment, the power amplification apparatus 100 is such as, but not limited to a IQ-based radio frequency analog-to-digital converter (RF DAC), to receive an original signal OS that is in a digital format, perform power amplification thereon and generate a simulated output signal OUT.

The power amplification apparatus 100 includes a digital pre-distortion circuit 110 and a power amplifier 120 (can be a Cartesian digital power amplifier).

The digital pre-distortion circuit 110 is configured to receive the original signal OS that includes an original real part OSI and an original imaginary part OSQ. In an embodiment, the digital pre-distortion circuit 110 performs processing based on the voltage levels of the original real part OSI and the original imaginary part OSQ, to generate an input signal IN that includes an input real part INI and an input imaginary part INQ.

More specifically, when the low state voltage level is represented as a logic value 0, and the high state voltage level is represented as a logic value 1, the voltage levels of the original real part OSI and the original imaginary part OSQ, represented by a pair of logic values, have four possible states, namely (0,0). (0,1), (1,0) and (1,1).

When a first one of the original real part OSI and the original imaginary part OSQ is determined to be a low state voltage level, and a second one of the original real part OSI and the original imaginary part OSQ is determined to be a high state voltage level, which is the combination of the logic values of either (0,1) or (1,0), the digital pre-distortion circuit 110 is configured to perform digital pre-distortion process.

Figure 2A:
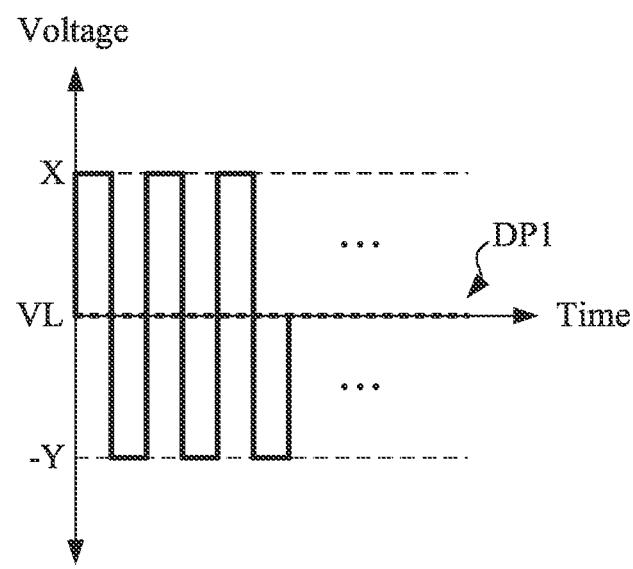
FIG. 2A and FIG. 2B illustrate diagrams of signal waveforms of the signals after the digital pre-distortion circuit performs the digital pre-distortion according to an embodiment of the present invention.
Figure 2B:
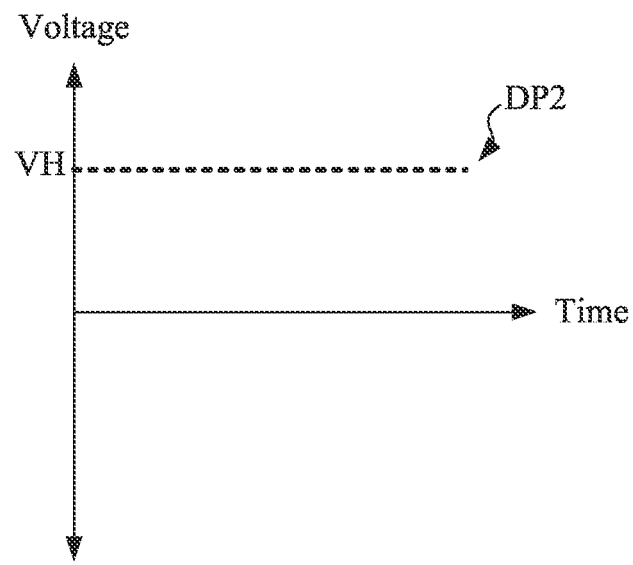

Reference is now made to FIG. 2A and FIG. 2B at the same time. FIG. 2A and FIG. 2B illustrate diagrams of signal waveforms of the signals after the digital pre-distortion circuit 110 performs the digital pre-distortion according to an embodiment of the present invention. In FIG. 2A and FIG. 2B, the X-axis represents time, and the Y-axis represents voltage.

When the original real part OSI is the low state voltage level VL (e.g. 0 volt) and the original imaginary part OSQ is the high state voltage level VH (e.g. 3 volts), the digital pre-distortion circuit 110 outputs a first voltage level X and a second voltage level −Y in an interlaced manner as a first pre-distortion part DP1 that is equivalent to the low state voltage level of the original real part OSI, as illustrated in FIG. 2A. Further, the digital pre-distortion circuit 110 directly output the original real part OSQ having the high state voltage level VH as the second pre-distortion part DP2, as illustrated in FIG. 2B.

The first pre-distortion part DP1 is the input real part INI of the input signal IN illustrated in FIG. 1. The second pre-distortion part DP2 is the input imaginary part INQ of the input signal IN illustrated in FIG. 1.

In an embodiment, the digital pre-distortion circuit 110 can selectively output the first voltage level X and the second voltage level −Y in the interlaced manner with identical frequencies as the first pre-distortion part DP1. After the averaging of the voltage levels, the result is equivalent to the low state voltage level VL having a value of X−Y.

For example, the values of X and Y can be equal and can be 3, for example. As a result, the digital pre-distortion circuit 110 outputs the first voltage level X that is 3 volts and the second voltage level Y that is −3 volts in the interlaced manner as the first pre-distortion part DP1 that is equivalent to the low state voltage level VL having the value of 0 volt (3−3=0).

In an embodiment, when the voltage levels are outputted with a fixed frequency, unnecessary glitches may occur at such a frequency on the frequency spectrum of the input signal IN. As a result, in another embodiment, the digital pre-distortion circuit 110 can output the first voltage level X and the second voltage level −Y with different frequencies.

Figure 3A:
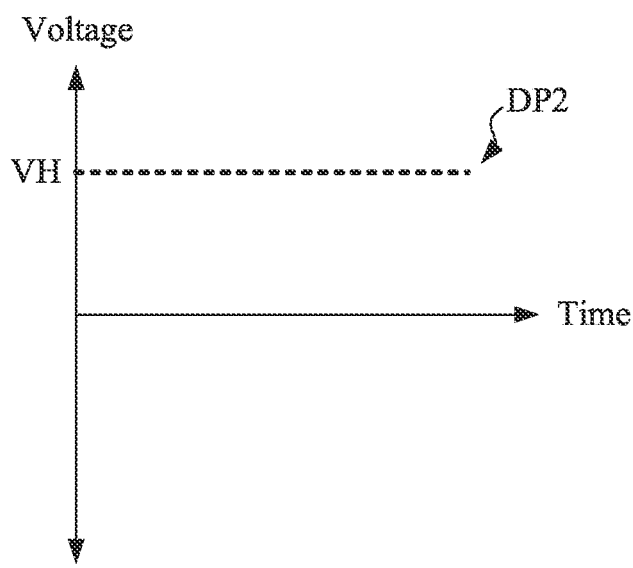
FIG. 3A and FIG. 3B illustrate diagrams of signal waveforms of the signals after the digital pre-distortion circuit performs the digital pre-distortion according to an embodiment of the present invention.
Figure 3B:
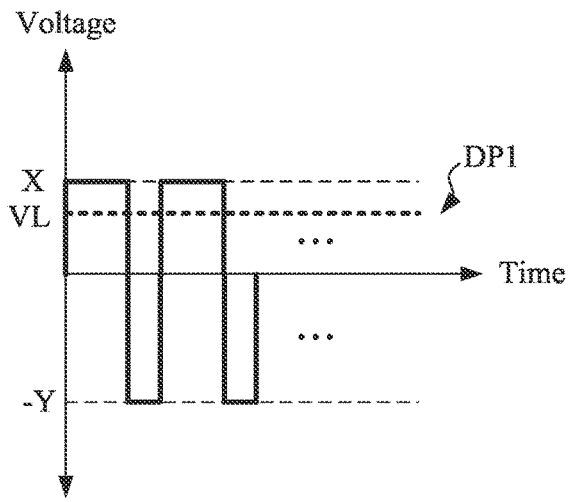

Reference is now made to FIG. 3A and FIG. 3B at the same time. FIG. 3A and FIG. 3B illustrate diagrams of signal waveforms of the signals after the digital pre-distortion circuit 110 performs the digital pre-distortion according to an embodiment of the present invention. In FIG. 3A and FIG. 3B, the X-axis represents time, and the Y-axis represents voltage.

When the original real part OSI is the high state voltage level VH (e.g. 3 volts) and the original imaginary part OSQ is the low state voltage level VL (e.g. 1 volt), the digital pre-distortion circuit 110 directly output the original real part OSI having the high state voltage level VH as the second pre-distortion part DP2, as illustrated in FIG. 3A. Further, the digital pre-distortion circuit 110 outputs the first voltage level X and the second voltage level −Y in an interlaced manner as the first pre-distortion part DP1 that is equivalent to the low state voltage level VL of the original imaginary part OSQ, as illustrated in FIG. 3B.

The first pre-distortion part DP1 is the input real part INQ of the input signal IN illustrated in FIG. 1. The second pre-distortion part DP2 is the input imaginary part INI of the input signal IN illustrated in FIG. 1.

The digital pre-distortion circuit 110 can selectively output the first voltage level X for N times and the second voltage level −Y for M times in the interlaced manner within each period as the first pre-distortion part DP1. After the averaging of the voltage levels, the result is equivalent to the low state voltage level VL having a value of (NX−MY)/(N+M).

For example, when the low state voltage level VL of the original real part OSI is 1 volt, the digital pre-distortion circuit 110 can set the values of X and Y as 1.5 volts and 2 volts respectively. As a result, the digital pre-distortion circuit 110 outputs the first voltage level having the value of 1.5 volts for 46 times and the second voltage level having the value of −2 volts for 21 times within each period as the first pre-distortion part DP1 that is equivalent to the low state voltage level VL having the value of 1 volt ((4×1.5−1×2)/(46+1)=1).

As a result, when the first voltage level X and the second voltage level −Y are outputted in the interlaced manner with different frequencies, the occurrence of glitches is determined by the occurrence numbers of M and N. The glitches thus have lower intensity and are distributed in a wider range on the frequency spectrum.

On the other hand, when each of the original real part OSI and original imaginary part OSQ is determined to be either the low state voltage level or the high state voltage level, e.g. the combination of the logic values of (0,0) or (1,1), the digital pre-distortion circuit 110 is configured to not perform the digital pre-distortion process. The digital pre-distortion circuit 110 directly outputs the original real part OSI and the original imaginary part OSQ as the input real part INI and the input imaginary part INQ of the input signal IN.

Subsequently, the power amplifier 120 is configured to receive the input signal IN to perform power amplification to generate the output signal OUT.

In common applications, the power amplifier is configured to transmit the output signal OUT to a load (not illustrated) electrically coupled thereto. For the power amplification apparatus implemented by such as the IQ-based RF DAC, the constant load can deviate from the ideal load under the actual operation status of the power amplifier and no longer maintain a one-to-one relation with the input signal.

More specifically, the deviation of the ideal load due to the different operation status results in a non-linear relation between the input signal and the output signal. When the one of the real part and the imaginary part of the input signal is the low state voltage level and the other one is the high state voltage level, the part having the high state voltage level would be affected by the part having the low state voltage level due to the deviation of the load and is not able to be outputted with full-swing. In a constellation diagram illustrated according to the real part and the imaginary part, the values of the real part and the imaginary part are supposed to fall within a range from −1 to 1 averagely such that the constellation diagram is an ideal square shape. However, due to the effect of the dynamic deviation of the load, the shape of the constellation diagram is twisted to have either a corner compression or a corner expansion phenomenon.

As a result, the power amplification apparatus of the present invention can use the digital pre-distortion mechanism to simulate the low state voltage level by outputting the voltage levels in the interlaced manner, such that the high state voltage level is not affected by the low state voltage level under the condition that the load deviates to be outputted with full swing. The power of the output signal can thus be increased.

It is appreciated that the values of each of the voltages and the number of output times of the first voltage level and the second voltage level described in the above embodiments are merely an example. In other embodiments, the values of each of the voltages and the number of output times of the first voltage level and the second voltage level can be adjusted depending on practical requirements. The present invention is not limited thereto.

Figure 4:
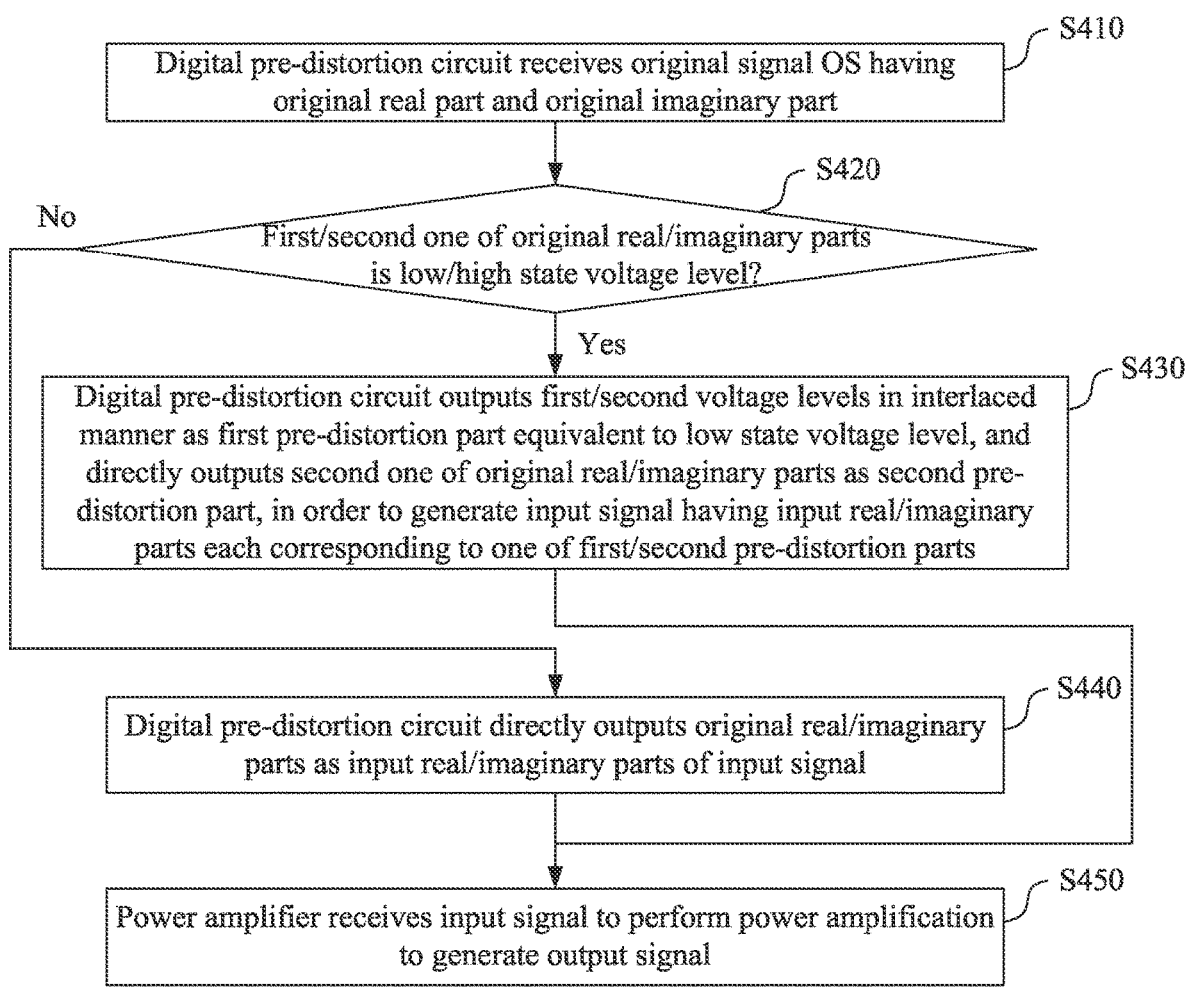
FIG. 4 illustrates a flow chart of a power amplification method according to an embodiment of the present invention.

Reference is now made to FIG. 4. FIG. 4 illustrates a flow chart of a power amplification method 400 according to an embodiment of the present invention.

In addition to the apparatus described above, the present disclosure further provides the power amplification method 400 that can be used in such as, but not limited to, the power amplification apparatus 100 in FIG. 1. As illustrated in FIG. 4, an embodiment of the power amplification method 400 includes the following steps.

In step S410, the original signal OS having the original real part OSI and the original imaginary part OSQ are received by the digital pre-distortion circuit 110.

In step S420, whether a first one of the original real part OSI and the original imaginary part OSQ is a low state voltage level and a second one of the original real part OSI and the original imaginary part OSQ is a high state voltage level are determined by the digital pre-distortion circuit 110.

In step S430, when the first one of the original real part OSI and the original imaginary part OSQ is determined to be the low state voltage level and a second one of the original real part OSI and the original imaginary part OSQ is determined to be a high state voltage level, the digital pre-distortion is performed by the digital pre-distortion circuit 110 to output the first voltage level and the second voltage level in the interlaced manner as the first pre-distortion part DP1 that is equivalent to the low state voltage level, and directly output the second one of the original real part OSI and the original imaginary part OSQ as the second pre-distortion part DP2, in order to generate the input signal IN having the input real part INI and the input imaginary part INQ each corresponding to one of the first pre-distortion part DP1 and the second pre-distortion part DP2.

In step S440, when each of the original real part OSI and the original imaginary part OSQ is determined to be either the low state voltage level or the high state voltage level, the digital pre-distortion circuit 110 directly outputs the original real part OSI and the original imaginary part OSQ as the input real part INI and the input imaginary part INQ of the input signal IN.

In step S450, after the steps S430 and S440 are finished, the power amplifier 120 receives the input signal to perform power amplification to generate the output signal.

It is appreciated that the embodiments described above are merely an example. In other embodiments, it should be appreciated that many modifications and changes may be made by those of ordinary skill in the art without departing, from the spirit of the disclosure.

In summary, the present invention discloses the power amplification apparatus and the power amplification method having a digital pre-distortion mechanism.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A power amplification apparatus having a digital pre-distortion mechanism, comprising:
   a digital pre-distortion circuit configured for:
      receiving an original digital signal having an original real part and an original imaginary part;
      determining that a first one of the original real part and the original imaginary part is a low state voltage level and a second one of the original real part and the original imaginary part is a high state voltage level;
      performing digital pre-distortion to output a first voltage level and a second voltage level in an interlaced manner as a first pre-distortion part that is equivalent to the low state voltage level, and directly output the second one of the original real part and the original imaginary part as a second pre-distortion part, in order to generate an input signal having an input real part and an input imaginary part each corresponding to one of the first pre-distortion part and the second pre-distortion part; and
   a power amplifier configured for receiving the input signal to perform power amplification in order to generate an output signal.

2. The power amplification apparatus of claim 1, wherein a value of the first voltage level is X and a value of the second voltage level is –Y, the digital pre-distortion circuit outputs the first voltage level and the second voltage level in the interlaced manner with identical frequencies as the first pre-distortion part that is equivalent to the low state voltage level having a value of X–Y, wherein each of X and Y is a positive number.

3. The power amplification apparatus of claim 2, wherein the values of X and Y are identical such that the low state voltage level has the value of 0.

4. The power amplification apparatus of claim 1, wherein a value of the first voltage level is X and a value of the second voltage level is –Y, the digital pre-distortion circuit outputs the first voltage level for N times and the second voltage level for M times within each period as the first pre-distortion part that is equivalent to the low state voltage level having a value of (NX–MY)/(N+M), wherein each of X and Y is a positive number and each of N and M is a positive integer.

5. The power amplification apparatus of claim 1, wherein the digital pre-distortion circuit is further configured for:
   when both the original real part and original imaginary part are determined to be the low state voltage level or the high state voltage level, directly outputting the original real part and original imaginary part as the input real part and the input imaginary part of the input signal.

6. A power amplification method having a digital pre-distortion mechanism used in a power amplification apparatus, comprising:
   receiving, by a digital pre-distortion circuit, an original digital signal having an original real part and an original imaginary part;
   when a first one of the original real part and the original imaginary part is determined to be a low state voltage level and a second one of the original real part and the original imaginary part is determined to be a high state voltage level, performing digital pre-distortion, by the digital pre-distortion circuit, to output a first voltage level and a second voltage level in an interlaced manner as a first pre-distortion part that is equivalent to the low state voltage level, and directly output the second one of the original real part and the original imaginary part as a second pre-distortion part, in order to generate an input signal having an input real part and an input imaginary part each corresponding to one of the first pre-distortion part and the second pre-distortion part; and receiving, by a power amplifier, the input signal to perform power amplification to generate an output signal.

7. The power amplification method of claim 6, wherein a value of the first voltage level is X and a value of the second voltage level is −Y, the power amplification method further comprises:

outputting the first voltage level and the second voltage level in the interlaced manner with identical frequencies as the first pre-distortion part that is equivalent to the low state voltage level having a value of X−Y by the digital pre-distortion circuit, wherein each of X and Y is a positive number.

8. The power amplification method of claim 7, wherein the values of X and Y are the identical such that the low state voltage level has the value of 0.

9. The power amplification method of claim 6, wherein a value of the first voltage level is X and a value of the second voltage level is −Y, the power amplification method further comprises:

outputting, by the digital pre-distortion circuit, the first voltage level for N times and the second voltage level for M times within each period as the first pre-distortion part that is equivalent to the low state voltage level having a value of (NX−MY)/(N+M), wherein each of X and Y is a positive number and each of N and M is a positive integer.

10. The power amplification method of claim 6, further comprising:

when both the original real part and original imaginary part are determined to be the low state voltage level or the high state voltage level, directly outputting, by the digital pre-distortion circuit, the original real part and original imaginary part as the input real part and the input imaginary part of the input signal by the digital pre-distortion circuit.

* * * * *